United States Patent
Carbone et al.

[11] Patent Number: 6,117,717
[45] Date of Patent: Sep. 12, 2000

[54] METHOD FOR AFTER GATE IMPLANT OF THRESHOLD ADJUST WITH LOW IMPACT ON GATE OXIDE INTEGRITY

[75] Inventors: Thomas A. Carbone, Gorham; Ronald Hulfachor, Standish, both of Me.

[73] Assignee: Fairchild Semiconductor Corporation, South Portland, Me.

[21] Appl. No.: 09/326,313

[22] Filed: Jun. 7, 1999

[51] Int. Cl.$^7$ .............................................. H01L 21/8238
[52] U.S. Cl. ..................... 438/202; 438/217; 438/276; 438/289; 257/370
[58] Field of Search .................................. 438/217, 276, 438/289, 216, 202; 257/370

[56] References Cited

U.S. PATENT DOCUMENTS

| | | |
|---|---|---|
| 4,784,966 | 11/1988 | Chen . |
| 4,789,883 | 12/1988 | Cox et al. . |
| 4,943,537 | 7/1990 | Harrington . |
| 5,238,849 | 8/1993 | Sato . |
| 5,346,835 | 9/1994 | Malhi et al. . |
| 5,348,896 | 9/1994 | Jang et al. . |
| 5,407,839 | 4/1995 | Maruo . |
| 5,648,288 | 7/1997 | Williams et al. . |
| 5,661,048 | 8/1997 | Davies et al. . |
| 5,670,401 | 9/1997 | Tseng . |
| 5,677,217 | 10/1997 | Tseng . |
| 5,688,722 | 11/1997 | Harrington . |
| 5,702,967 | 12/1997 | Tseng . |
| 5,747,368 | 5/1998 | Yang et al. . |
| 5,763,317 | 6/1998 | Lee et al. ................................ 438/448 |
| 5,792,699 | 8/1998 | Tsui . |
| 5,891,794 | 4/1999 | Ibok ....................................... 438/592 |

OTHER PUBLICATIONS

"A Novel CMOS Process Utilizing After–Gate–Implantation Process", by Mikoshiba, et al., 1986 Symposium VLSI Tech Digest of Tech Papers, p. 41, 1986.

"A Study of Boron Doping Profile Control for a Low Vt Device Used in the Advanced Low Power, High Speed Mixed–Signal IC",Flessner, et al., 1998 IEEE/SEMI Advanced Semiconductor Manufacturing Conference, p. 423, Aug. 1998.

*Primary Examiner*—Long Pham
*Attorney, Agent, or Firm*—Pierce Atwood; Chris A. Caseiro

[57] ABSTRACT

A method of forming an intermediate semiconductor structure as part of a BiCMOS process to provide for improved anti-punch-through (APT) protection and improved threshold-voltage (Vt) adjustment for the MOS devices of the structure. The method includes the fabrication of a split polysilicon layer and the introduction of APT and Vt related carriers after formation of the gate oxide layer. The intermediate structure includes the gate oxide layer and a protective amorphous silicon layer formed on the surface of the gate oxide layer in an in situ process. The protective amorphous structure is formed to protect the integrity of the gate oxide layer during subsequent acid washes associated with the BiCMOS process. The amorphous layer may be deposited in a thickness substantially less than that associated with prior spilt polycrystalline silicon processes. This allows for introduction of the APT and Vt related carriers using relatively standard implanting equipment. After acid washing is completed the amorphous layer is converted into polysilicon in subsequent polycrystalline silicon layer stages.

10 Claims, 4 Drawing Sheets

METHOD FOR AFTER GATE IMPLANT OF THRESHOLD ADJUST WITH LOW IMPACT ON GATE OXIDE INTEGRITY

BACKGROUND OF THE INVENTION

1. Field of the Invention

The present invention relates to methods of fabricating semiconductor devices. In particular, the present invention relates to the steps associated with the fabrication of Bipolar Complementary Metal Oxide Semiconductor (BiCMOS) structures. More particularly, the present invention relates to those aspects of the fabrication of BiCMOS structures involving the formation of the insulative oxide layer under the gates of the MOS transistors and the processes associated with adjusting the threshold voltage for such transistors. The present invention provides for fabrication of the gate oxide and the threshold adjustment with little impact on the integrity of the gate oxide as part of a BiCMOS fabrication process.

2. Description of the Prior Art

In an effort to create increasingly faster semiconductor devices that consume less power, it is a goal in the semiconductor industry to create increasingly smaller integrated circuit (IC) devices. To that end, the steps associated with the fabrication of IC devices are becoming more critical and complex. With increasing complexity and criticality comes significant potential for a decrease in productivity, including greater fabrication costs and lower device yield. It is therefore a continuing goal in this field to minimize fabrication steps and the time and errors associated therewith.

Improvements are sought in all areas of semiconductor fabrication, particularly so in advanced processes. In the field of advanced BiCMOS devices, the integration of the steps associated with the formation of bipolar devices and MOS devices creates the type of complexity that requires considerable fabrication coordination. The addition of more masks, implants, depositions, etchings, and the like for advanced BiCMOS processing increases the costs associated with raw materials, capital equipment, and direct and indirect labor obligations. Moreover, modifications made in some steps are likely to affect fabrication results related to subsequent steps. It is therefore important to take into account the entirety of the integrated fabrication process when creating BiCMOS devices.

One area in particular in which fabrication integrity must be maintained is in the formation of the active areas of the transistors. With particular regard to the N-type and P-type MOS transistors, it is important to ensure that the gate oxide layer used to electrically isolate the source, drain, and channel regions from the gate not be compromised during subsequent fabrication steps. That goal can be difficult to achieve when during subsequent steps conductive ions are implanted into active areas in order to establish a reliable turn-on potential or threshold voltage of the transistor. However, it is important to ensure certainty in the operation of the transistor so the transistor's threshold potential must be well defined and so the introduction of the conductive ions is critical.

Resolution of those seemingly opposite goals may be possible when the fabrication process is restricted to formation only of MOS structures. However, it can be particularly difficult in a BiCMOS process in which certain fabrication steps are applicable for one type of active device, e.g., a bipolar transistor, but not for another, e.g., a PMOS transistor. The fabrication of MOS transistors with high gate oxide integrity and suitable threshold voltage adjustment is an important component of the BiCMOS process but is not an isolated part of that process. Therefore, a BiCMOS process that resolves gate oxide integrity and voltage adjust would be of particular use.

In general, there are approximately 20 significant processing or mask steps associated with a BiCMOS fabrication process related to the present invention. Those steps, identified by the mask designations noted, are substantially as follows:

| Mask No. | Mask Function |
| --- | --- |
| 1.0 | N+ Buried Layer Mask |
| 2.0 | P+ Buried Layer Mask |
| 3.0 | Isolation Oxide Definition Mask |
| 4.0 | Sink Implant Mask |
| 5.0 | Channel Stop and PWell Mask |
| 6.0 | P-type Anti-punch Through & Threshold Adjust Mask |
| 7.0 | N-type Anti-punch Through & Threshold Adjust Mask |
| 8.0 | Base Definition Mask |
| 9.0 | N+ Poly Layer Mask |
| 10.0 | Polycrystalline Silicon Gate Definition Mask |
| 11.0 | N LDD Mask |
| 12.0 | P LDD Mask |
| 13.0 | P+ Source/Drain Definition Mask (PMOS) |
| 14.0 | N+ Source/Drain Definition Mask (NMOS) |
| 15.0 | Source/Drain Definition Mask (NMOS) |
| 16.0 | Contact Definition Mask |
| 17.0 | METAL 1 (M1) Definition Mask |
| 18.0 | VIA Definition Mask |
| 19.0 | METAL 2 (M2) Definition Mask |
| 20.0 | Bond Pad Definition Mask |

Of course, each one of the noted steps includes a plurality of sub-steps, some more so than others. In fact, there are more than one hundred steps associated with the formation of a BiCMOS structure, each of which is important to creation of high quality, reliable devices.

While there are many steps and stages associated with the complete fabrication of an integrated circuit on a semiconductor wafer, the ones set out above and described briefly herein are directly applicable to the present invention. Of particular interest in regard to the present invention are the steps related to formation of the insulative gate oxide and subsequent adjustment of the conductivity of the active regions of the transistor device. Prior to addressing important aspects of the formation of those two areas of a BiCMOS device, the fabrication process will be described briefly in relation to the noted mask steps.

Initially, for a BiCMOS device including an NPN bipolar transistor, a buried collector layer is created on a P type substrate of semiconductor material using conventional fabrication sequences. This is accomplished by introducing, such as by implantation, an N concentration of relatively slow diffusing N type atoms to form an underlying layer for subsequent retrograde diffusion. Next, an "NWell" and a "PWell" are created on the P type substrate of semiconductor material, using conventional fabrication sequences. This is accomplished by introducing, such as by implantation, respectively, an N concentration of relatively fast-diffusing N type atoms to form an NWell "bed" for the PMOS structure, and a P concentration of relatively fast-diffusing P type atoms to form a PWell "bed" for the NMOS structure. Additionally, the P type atoms are introduced into area adjacent to the buried collector layer and the NWell bed to form channel stops for isolation of adjacent active areas. The channel stops isolate the wells from parasitic MOS effects caused by adjacent structures.

After NWell and PWell bed introduction into the substrate, an epitaxial layer in the form of single crystal N type semiconductor material in an N⁻ concentration is formed over the buried collector layer and both well beds. Subsequent conventional diffusion processing drives the NWell and PWell atoms in retrograde concentrations to the surface of the epitaxial layer. The slower diffusing collector layer atoms move toward that surface but do not reach it. Next, isolation oxide layers are formed about the transistor structures by conventional mask, etch, and formation sequences so as to isolate them from adjacent structures. Field oxide regions are formed above the isolation regions to aid in the isolation of adjacent structures at the surface of the epitaxial layer. A collector sink of relatively fast-diffusing N type atoms is then introduced into the epitaxial layer above a portion of the buried collector layer for subsequent collector development.

Continuing with the summary description of the BiCMOS process of interest, formation of the MOS transistor structures requires the fabrication of the gate, source, and drain components of the NMOS and PMOS transistor structures. Additionally, formation of the bipolar transistor structures requires the fabrication of the base, emitter and collector components. For the MOS structures, channel regions for the PMOS and NMOS transistor structures are doped with appropriate levels of conductive ions to tailor threshold voltage (Vt) and anti-punch through (APT) protection characteristics of the device to be formed. Subsequently, the dielectric gate oxide layer is formed after an epitaxial layer surface clean and a thermal processing to be described briefly herein. The gates are then formed of a polycrystalline layer of semiconductor material, using a well-known mask, etch, and deposition sequence. This "polysilicon layer" is formed on the surface of the respective wells, but is separated from the well surfaces by the underlying gate oxide layer. In the BiCMOS process, the polysilicon layer is used to form polycrystalline silicon gates of the MOS transistors and a polysilicon emitter of the bipolar transistor upon suitable subsequent implanting.

The gate oxide layer insulates the gate of the particular MOS transistor structure from the source, the drain, and the channel lying therebetween. The integrity of this gate oxide layer must be maintained throughout the integrated fabrication process so as to ensure effective transistor operation. It is preferably relatively thin so as to produce good MOS transconductance, to reduce Drain-Induced Barrier Lowering (DIBL) and short channel effects, and to increase source/drain punch-through voltage (BVDSS). It is to be noted that this oxide layer is also used in the BiCMOS process to form a dielectric layer for desired sink-based capacitances.

It is important to make the Vt adjust and corresponding APT protection regions of the MOS structures as thin and as well defined as possible in order to minimize DIBL and short-channel effects. Specifically, the APT profile must be well-defined in order to establish a distinct channel region while at the same time not extending past the source/drain junction depths that would otherwise increase drain-to-well capacitance. Doping concentrations and energies (when preferably performed by implant) must be carefully established in order to control the characteristics of this region of the MOS devices. However, thermal processing necessary to establish the gate oxide layer causes diffusion of the Vt/APT implants and therefore reduces the definition, and increases the thickness, of those regions.

In order to accommodate the different characteristics of the two types of transistors without degrading the quality of either, it has been determined that there are advantages in creating the polysilicon layer in two separate steps. This "split poly" process involves the introduction of a relatively thin layer of polycrystalline silicon over the gate oxide layer in a blanket deposition. On the bipolar side, relatively slow diffusing P type atoms in a P+ concentration are implanted into the surface of the epitaxial layer through the first polycrystalline silicon layer while the collector sink and CMOS active areas are protected by photoresist. It is important to note that the thickness of the first polycrystalline silicon layer must be well defined for purposes of the base implant. That is, if it is too thick the implant may not be driven deep enough to ensure desirable bipolar transistor characteristics.

After the base implant, the first polycrystalline silicon layer and the gate oxide layer are etched away on the surface of the base region only. The remaining active areas are again protected by photoresist. The next phase of the process involves the preparation of the wafer for development of the emitter and collector of the bipolar transistor structure and the gates, and source and drains of the CMOS transistor structures. Prior to undertaking the steps associated with that formation, the entirety of the surface of the first polysilicon layer is pre-cleaned with an acidic compound. A second polysilicon layer is then deposited on the cleaned surface of the first layer. The second polycrystalline silicon layer is substantially thicker than the first. The combination of the two polycrystalline silicon layers creates the pre-cursors for the gates of the CMOS transistor structures and the emitter of the bipolar transistor structure. That is, the two layers are electrode materials. Subsequent well-known steps are used to complete the remainder of the integrated circuitry.

In one particular split-poly BiCMOS fabrication process used by Fairchild Semiconductor Corporation of South Portland, Me., for the development of the gate oxide and first polycrystalline silicon layer formation first includes a standard pre-cleaning of the epitaxial layer for subsequent oxide growth. The gate oxide layer is then grown in an atmosphere of oxygen at a processing temperature on the order of 900° C. Next, the first polycrystalline semiconductor layer in the split polycrystalline silicon process is formed using a chemical vapor deposition (CVD) at about 600°–625° C. The polycrystalline silicon is grown to a thickness of about 50 nanometers (nm) over a period of about two hours. However, that entire thermal processing adversely affects the Vt adjust and APT protection for the MOS transistor structures.

It has been determined that this first polycrystalline silicon layer must be at least as thick as noted in order to ensure that the subsequent surface cleaning of the first polycrystalline silicon layer will not be problematic for the underlying oxide layer. That cleaning relates to the removal of a photoresist layer required to ensure the definition of certain regions of the bipolar structure of the BiCMOS integrated circuitry. It is known that the acid cleaner use to remove that resist can migrate through interstices associated with the molecular orientation of the polycrystalline silicon. If permitted to move through to the gate oxide layer, the acid causes considerable damage to the insulative characteristics of that layer. Such damage often leads to reduce fabrication yields which have to this point been accepted as a standard cost involved in fabricating BiCMOS structures.

While the integrity of the gate oxide layer is of obvious concern, the degradation of the Vt and APT characteristics caused by the thermal development of that layer is also of increasing importance. To solve that particular problem, it has been suggested to introduce the dopants required for Vt adjust and APT protection after formation of the gate oxide layer. In that way, the diffusion of dopant in the region underlying the gate oxide layer caused by the prior thermal profile is significantly reduced. In an article entitled "A Novel CMOS Process Utilizing After-Gate-Implantation Process," Mikoshiba et al. describe the introduction of the threshold adjust dopant subsequent to gate oxide formation. However, the dopant is implanted through the very thick polysilicon layer, requiring very high doping energies to insure that the dopant reaches the appropriate depth under the oxide. This involves the use of very expensive equipment and may cause damage in other ways related to the implant energy required including, but not limited to, channeling problems. In that regard, the Mikoshiba process is not particularly applicable in many processes, including BiCMOS fabrication.

U.S. Pat. No. 5,407,839 issued to Maruo also suggests the introduction of Vt/APT controlling dopants subsequent to gate oxide formation. Maruo teaches such processing only in the context of MOS formation rather than in the more-critically-integrated process of BiCMOS fabrication. The Maruo process includes a suggestion to implant the dopant through the gate oxide but fails to address the importance of maintaining the integrity of the gate oxide layer during intermediary bipolar structure fabrication stages. That is, as previously indicated, the thickness of the first polycrystalline silicon layer must be well defined for purposes of the base implant. If it is too thick the base implant energy will need to be higher, creating a greater implant range and, thus, increasing basewidth and reducing bipolar speed, which is crucial for very high frequency operations, including in the multi-GHz range. That critical thickness is of significantly less importance in a CMOS-only device and so the thin poly layer may be made substantially thicker in order to protect the oxide integrity in subsequent etching steps without sacrificing electrical characteristics. Suggestions are made to use a split polysilicon layer to improve implant prospects, but Maruo fails to address the importance of keeping the first layer relatively thin without sacrificing oxide integrity in the BiCMOS process so that the base doping profile will be optimized.

Therefore, what is needed is an improved BiCMOS fabrication process that includes a reduction in yield loss associated with gate oxide integrity while also providing for an improved Vt/APT region of the MOS structures. What is also needed is such an improved BiCMOS fabrication process that involves the formation of the gate oxide layer and the split polycrystalline silicon layers such that the new structure includes a thinner first polycrystalline silicon layer without sacrificing gate oxide integrity (or base doping profile). Yet further, what is such an improved BiCMOS fabrication process that permits introduction of suitable Vt adjust and APT protection dopants without the need to use high energy implant equipment and without causing related channeling problems.

SUMMARY OF THE INVENTION

It is an object of the present invention to provide an improved BiCMOS fabrication process that includes a reduction in yield loss associated with gate oxide integrity while also providing for an improved Vt/APT region of the MOS structures. It is also an object of the present invention to provide an improved BiCMOS fabrication process that involves the formation of the gate oxide layer and the split polycrystalline silicon layers such that the new structure includes a thinner first polycrystalline silicon layer without sacrificing gate oxide integrity. Yet further, it is an object of the present invention to provide an improved BiCMOS fabrication process that permits introduction of suitable Vt adjust and APT protection dopants without the need to use high energy implant equipment and without causing related channeling problems.

These and other objectives are achieved in the present invention through a novel fabrication process that creates a new wafer-in-process structure. The fabrication process involves the in situ deposition of both the gate oxide layer and the first protective electrode layer within a single vertical batch reactor. More importantly, the first protective electrode layer—the equivalent of the first polycrystalline silicon layer of the split polysilicon process of the prior art—is formed in the present invention as an amorphous silicon layer in the in situ process. The amorphous layer does not have the interstices necessary to form pathways for acid migration during intermediary cleaning steps related to bipolar structure processing steps. As a result, the deposited amorphous silicon electrode layer will protect the gate oxide layer and can do so at a thickness substantially less than the thickness of the prior first polycrystalline silicon layer. In that way, Vt adjust and APT protection dopants can be introduced into the active areas underlying the formed gate oxide layer and the amorphous silicon layer and established under much less thermal conditioning than occurred previously. Subsequent BiCMOS fabrication steps, including the deposition and thermal forming of the much thicker second polycrystalline silicon layer, convert the amorphous structure into the polycrystalline electrode structure needed for gate and emitter formation with little impact on the profile of the Vt adjust/APT protection-related regions.

In order to enable the after-gate implant of the adjustment dopants, the present invention preferably includes the use of in-situ processing to create the gate oxide layer and the protective first layer of electrode material. As described in related U.S. patent application Ser. No. 09/158,256, filed Sep. 22, 1998, in the name of Thomas Carbone, one of the co-inventors of the present invention and entitled "Insitu Deposition of Gate Oxide and Amorphous Silicon Electrode and Corresponding Structure," a single vertical reactor is used to form both layers. The contents of the noted application are incorporated herein by reference.

The formation of an amorphous CVD silicon layer rather than a polycrystalline layer reduces cycle time to an extent. Since the amorphous layer may be less than the prior 50 nm in thickness, the dwell time within the reactor for that stage of the cycle is reduced. However, that time savings is somewhat offset by the reduction in processing temperature required to ensure that an amorphous rather than polycrystalline silicon is formed. That temperature must be less than the 600° C. level, and should be on the order of 500°–540° C.

Use of a thin amorphous silicon layer as an intermediary part of the fabrication process subsequent to oxide layer formation enables introduction of the dopant needed to adjust the MOS turn-on potential to that desired and to minimize punch-through possibilities. Moreover, the use of a thin rather than relatively thick silicon layer over the oxide allows for implantation of the dopant using standard implant energies available with standard processing equipment. Preliminary evaluations of the electrical characteristics of the MOS structures formed using the two split silicon layers and the after-gate implant of the Vt adjust and APT protection dopants confirms that this processing provides better protection to the gate oxide layer and more reliability and improved performance with regard to drive current and peak transconductance.

These and other advantages of the present invention will become apparent upon review of the following detailed description, the accompanying drawings, and the appended claims.

DESCRIPTION OF THE PREFERRED EMBODIMENT OF THE INVENTION

A novel method of fabricating a new intermediary BiCMOS structure of the present invention is described in conjunction with a series of fabrication steps resulting in the intermediary structures shown in FIGS. 1–8. The fabrication process used to form the structure has been integrated into the BiCMOS fabrication steps previously noted, with a reduction in the number of sub-steps associated with two key thermal growth stages. The overall BiCMOS transistor structure mask sequence is the sequence summarized in the Background of the Invention. While the present discussion relates to the formation of a BiCMOS structure including an NPN type bipolar transistor, it is to be understood that the process described herein may also be used in a BiCMOS fabrication process involving the formation of a PNP bipolar transistor.

Figure 1:
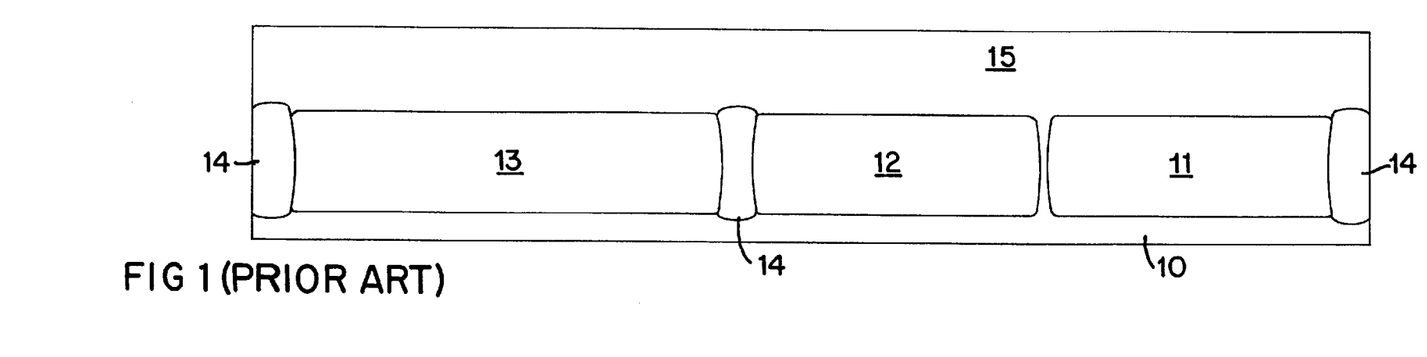
FIG. 1 is a simplified diagrammatic elevation view of the structure resulting from the prior-art steps associated with initial sequences of the BiCMOS fabrication process, showing the buried collector layer of an NPN transistor structure and the NWell and PWell of the CMOS structure.

Prior to the fabrication sequences used to form in situ the gate oxide and amorphous silicon protective layer of the present invention, a substrate 10 of P is used as the foundation to form the active devices. As shown in FIG. 1, a retrograde NWell region 11 for a PMOS transistor, a retrograde PWell region 12 for an NMOS transistor, and a buried collector layer 13 for an NPN bipolar transistor are formed in the substrate 10. The NWell region 11 and the buried collector layer 13 are formed at the same time of N type atoms in an N+ concentration. Channel stop regions 14 are formed at the same time that the PWell region 12 is formed. Both are formed of P type atoms in a P+ concentration. The channel stop regions 14 are designed to isolate adjacent active structures. A single crystal epitaxial layer 15 of N⁻ silicon is then deposited uniformly over all surfaces in a blanket epitaxial deposition.

Figure 2:
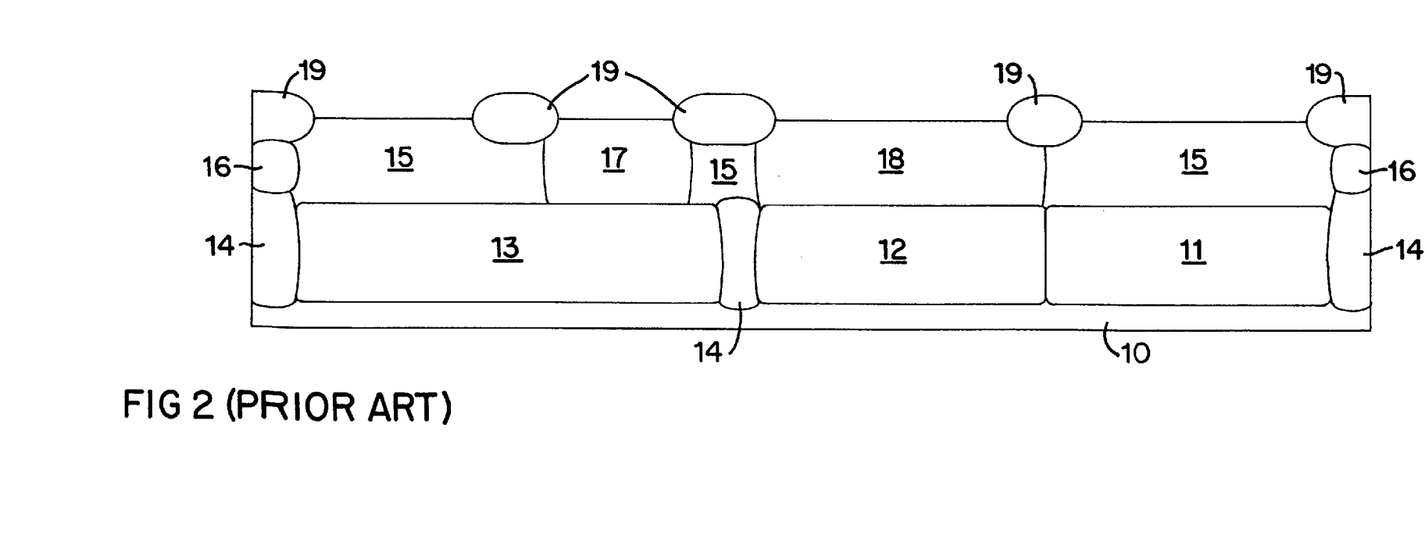
FIG. 2 is a simplified diagrammatic elevation view of the structure resulting from the prior-art steps associated with intermediary Mask sequences of the BiCMOS fabrication process, showing the framed field oxide regions, the buried isolation oxide layers, and the collector sink of the NPN transistor structure.

As illustrated in FIG. 2, isolation oxide regions 16 are established around the active structures above the channel stop regions 14 and near a surface of the epitaxial layer 15. That is, the isolation oxide regions 16 diffuse to meet the channel stop regions 14, pinching any potential channel in that location. The oxidation process causes upward diffusion of regions 11–13. Additionally, a collector sink region 17 of relatively fast diffusing N type atoms in an N+ concentration is formed in the epitaxial layer 15 above a portion of the buried collector layer 13 for subsequent upward diffusion. The collector sink region 17 forms the basis of the electrical pathway for the collector of the NPN transistor. An implant of relatively fast diffusing P type atoms in a P concentration is formed in the epitaxial layer 15 over the PWell region 12 is used to form a P channel 18 of the NMOS transistor. Further, field oxide regions 19 for framing the active structures are formed in the surface of the epitaxial layer 15 at well-defined sites during subsequent oxidation steps. The field oxide regions 19, which add about 100 nm to the thickness of the isolation oxide regions 16, isolate what will become the PMOS transistor, the NMOS transistor, and the bipolar transistor from each other.

Figure 3:
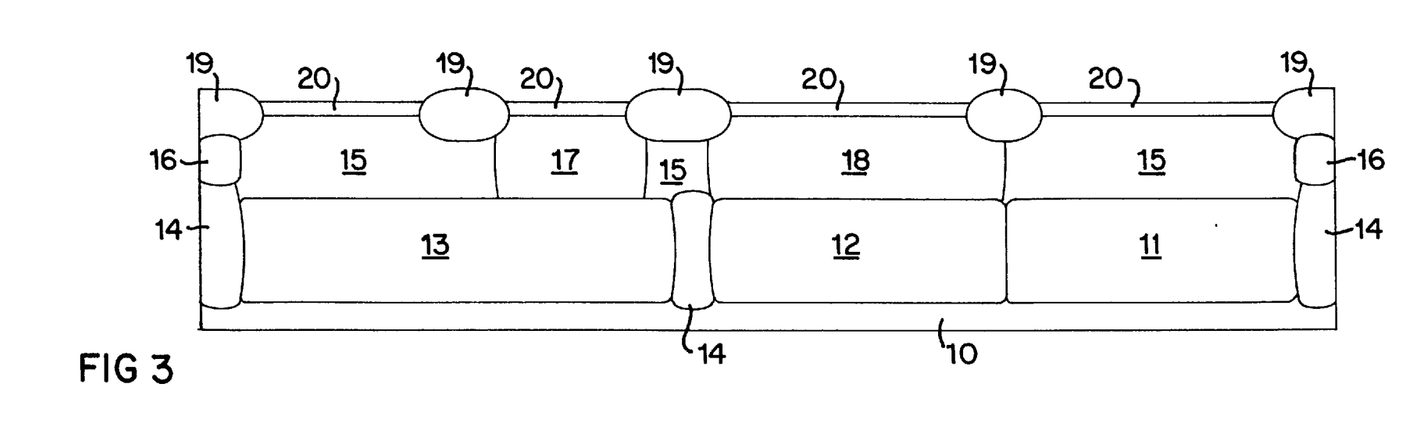
FIG. 3 is a simplified diagrammatic elevation view of the structure resulting from the new in situ sequence, showing the gate oxide layer grown on the surface of the epitaxial layer in the novel in situ process of the present invention.
Figure 4:
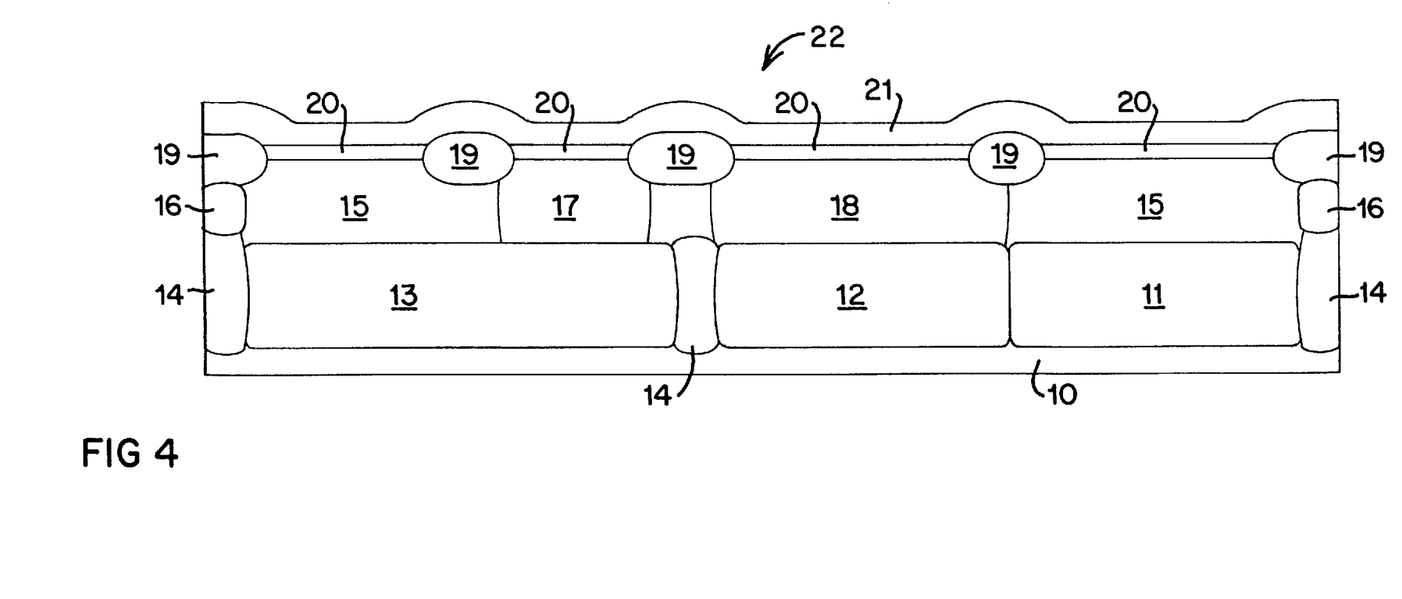
FIG. 4 is a simplified diagrammatic elevation view of the structure resulting from the new in situ sequence, showing the amorphous silicon layer of a subsequent split polycrystalline silicon sequence, deposited during the in situ process of the present invention.

As illustrated in FIGS. 3 and 4, the process of the present invention includes the in situ steps of forming within the same vertical batch reactor a gate oxide layer 20 first formed as shown in FIG. 3, and a protective layer of amorphous silicon 21 as described in the Carbone application previously referenced and shown in FIG. 4. The reaction temperature used to develop the oxide layer is on the order of about 900° C. While that temperature is required to establish the insulative gate oxide layer 20, it is to be understood that such temperatures will cause the migration of ions forming part of the entire structure. If the Vt adjust and APT protection dopants had been introduced into the epitaxial layer 15 before formation of the oxide layer 20, they too would migrate. However, the process of the present invention involves a key change of the sequence of steps, made possible by the use of the intermediary amorphous silicon layer 21 shown in FIG. 4. In the sequence change, the Vt/APT dopants are implanted subsequent to oxide layer formation.

With continuing reference to FIG. 4, the amorphous silicon layer 21 is formed during the same vertical batch reaction process used to create the oxide layer 20. That is achieved by introducing silane gas in a chemical vapor deposition step carried out at a substantially lower temperature of about 500–550° C. This processing temperature ensures that migration fields will not be formed in the protective oxide layer 20 in that the deposited silicon will be an amorphous structure. Moreover, creation of the amorphous layer 21 allows for a reduction in the required thickness of that layer without effect on the integrity of the underlying oxide layer 20. In the preferred embodiment of the present invention, layer 21 is about 30 nm thick. The result of the single batch reaction process is an intermediate semiconductor structure 22 of the present invention including layers 20 and 21 formed in situ.

Figure 5:
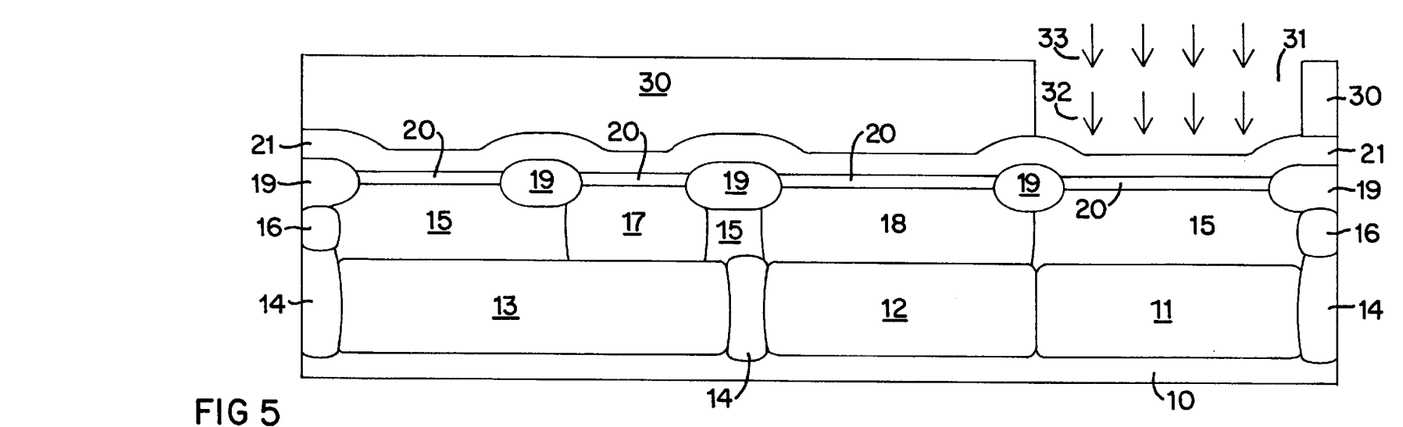
FIG. 5 is a simplified diagrammatic elevation view of photoresist mask step during which N-type atoms are implanted into the epitaxial layer below the amorphous silicon layer and the gate oxide layer for voltage adjust and anti-punch through protection in the NWell of the PMOS transistor section of the BiCMOS device.

After the thermal processing used to form layers 20 and 21, two ion implant masks and related steps are used to establish threshold voltage adjust and anti-punch through protection for the two MOS structures of opposite conductivity. First, as illustrated in FIG. 5, a first dopant adjust photoresist mask 30 includes mask opening 31 for the introduction of two sets of P-type atoms. A first set of atoms, preferably Arsenic, is used in a PMOS anti-punch through implant 32 to increase the NWell doping below the MOS channel to decrease DIBL and short-channel effects and to increase the source/drain punch-through voltage. A second set of atoms, preferably Boron in a different concentration, is used in a PMOS threshold-adjust implant 33 to create a thin P-type layer of conductivity just below the gate oxide layer 20. It is to be noted that the thin P-type layer established by implant 33 is fully depleted due to Fermi level differences and therefore does not leak drain-to-source. The implants may be achieved in a manner well known to those skilled in the art. As noted, it is important to have thin and well-defined regions in the MOS channels in order to avoid, among other problems, drain-to-well capacitance increases. Therefore, implants 32 and 33 are made through layers 20 and 21 to avoid the thermal processing associated with the growth of oxide layer 20. It is to be noted that while implant 33 may be carried out using Phosphorus as the carrier, it is preferred to use Arsenic for greater dopant control. In addition, the dopant implantations through the gate oxide and the amorphous silicon layers may decrease the channeling of those dopants, thereby also providing increased dopant control.

Figure 6:
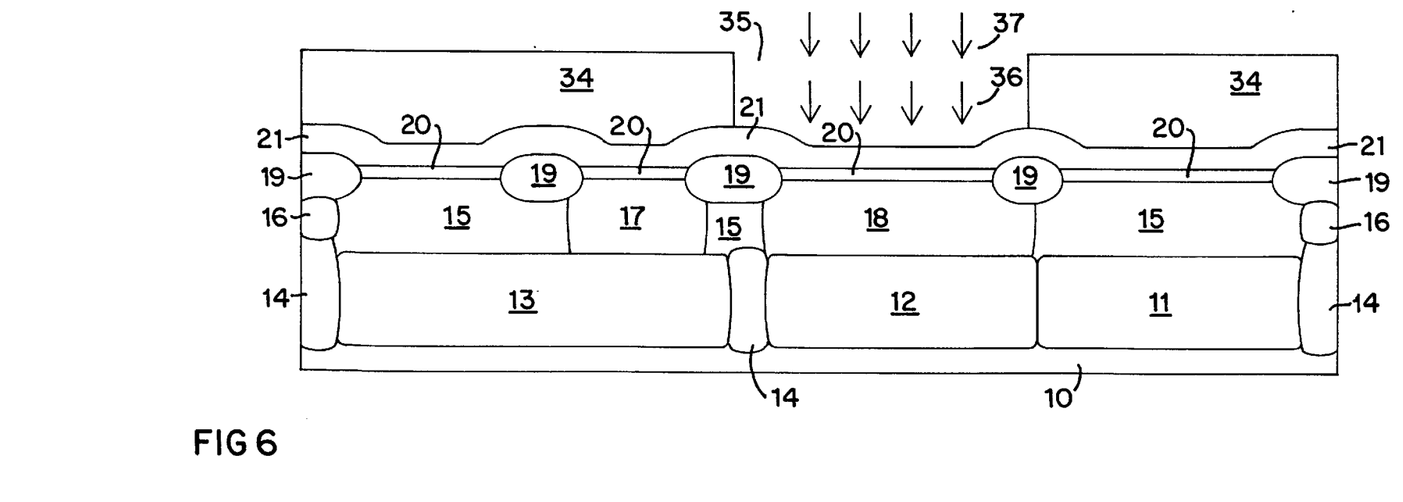
FIG. 6 is a simplified diagrammatic elevation view of photoresist mask step during which P-type atoms are implanted into the epitaxial layer below the amorphous silicon layer and the gate oxide layer for voltage adjust and anti-punch through protection in the PWell of the NMOS transistor section of the BiCMOS device.

Establishing the electrical characteristics of the NMOS structure is achieved in a similar manner as that described with the arrangement shown in FIG. 5. Specifically, as shown in FIG. 6, a second dopant adjust photoresist mask 34 includes mask opening 35 for the introduction of two sets of P-type atoms. A first set of atoms, preferably Boron, is used in an NMOS anti-punch through implant 36 to reduce sub-channel drain-to-source leakage and punch-through. This particular implant must be deep enough to minimize its effect on the channel doping profile so that the Vt of the NMOS transistor created is primarily determined by the Vt implant. To that end, a second set of atoms, also preferably Boron but in a different concentration, is used in an NMOS threshold-adjust implant 37 to create a thin P-type layer of conductivity just below the gate oxide layer 20. It can be seen that the implant 36 through the gate oxide layer 20 and the intermediary silicon layer 21 after that thermal cycling helps to keep the APT dopant at a certain concentration out of the channel just under the gate oxide layer 20, thereby allowing the carrier concentration provided by implant 37 to dominate for Vt adjust purposes. In addition, the dopant implantations through the gate oxide and the amorphous silicon layers may decrease the channeling of those dopants, thereby also providing increased dopant control.

Figure 7:
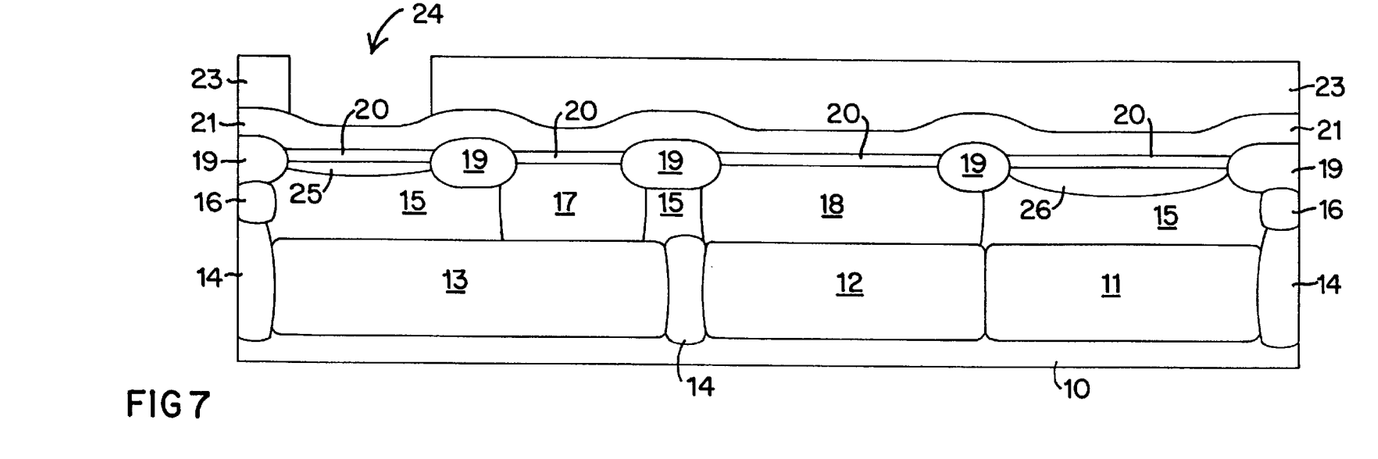
FIG. 7 is a simplified diagrammatic elevation view of the structure resulting from subsequent prior-art sequences, showing the photoresist mask for implantation of the base region of the NPN transistor structure and subsequent etching away of the gate oxide layer and amorphous silicon layer of the present invention.

FIG. 7 illustrates a cross-sectional view of the results of follow-on processing steps related to the formation of a base region of the NPN transistor structure. Specifically, a base photoresist mask 23 includes mask opening 24 for the introduction of relatively slow diffusing P type atoms in a P++ concentration through protective layer 21 and oxide layer 20 to form base region 25. That same mask 23 is then used to isolate the PMOS and NMOS areas as the protective layer 21 and the oxide layer 20 are etched away over the base region 25. This is done in preparation of later steps related to formation of the emitter region of the NPN transistor structure. Region 26 is preferably formed in subsequent intermediate steps not specifically related to the key aspects of the present invention to provide some dopant adjustment to the PMOS transistor as desired. All surfaces are then cleaned with a hydrofluoric acid wash as a necessary step to aid in the formation of a suitable emitter of the NPN transistor structure.

Figure 8:
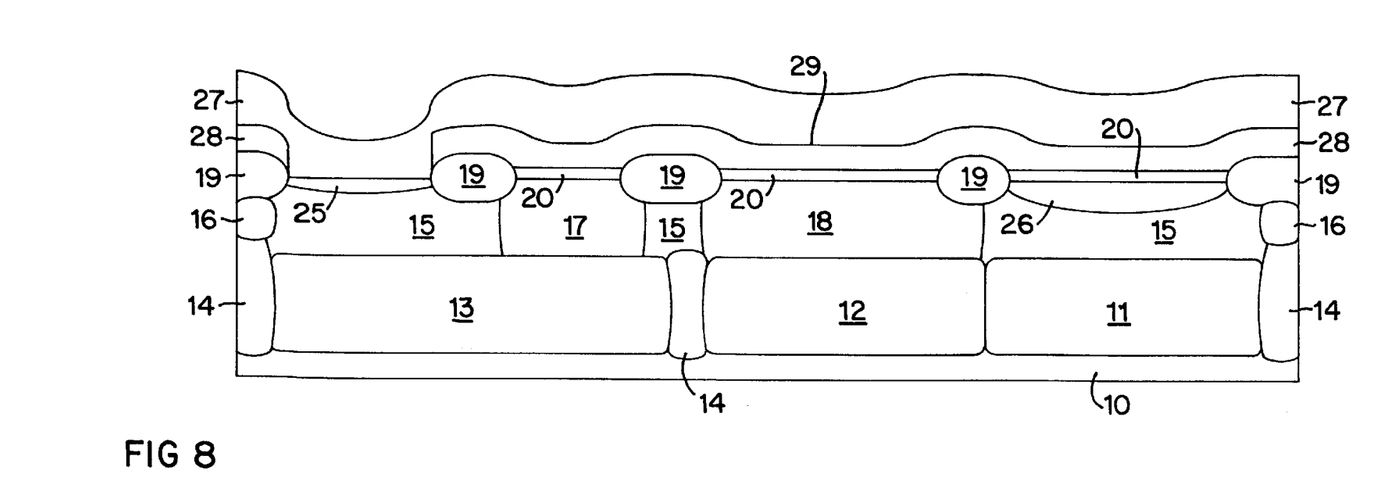
FIG. 8 is a simplified diagrammatic elevation view of the structure resulting from a prior-art subsequent sequence, showing the deposited polysilicon layer used to form the gates of the CMOS structure and the polysilicon emitter of the NPN transistor structure.

As illustrated in FIG. 8, a second silicon layer 27 is formed in a blanket chemical vapor deposition process using silane gas. The conditions used to form layer 27 in a split polysilicon process—namely temperatures in excess of 600° C.—also transform amorphous silicon layer 21 into a first polysilicon layer 28 of the type necessary for following development of MOS gates and a polysilicon emitter, all suitably doped for the necessary threshold characteristics. As can be seen in FIG. 8, the two layers 27 and 28 include a polysilicon interface 29, all of which is substantially the same as the structure associated with the prior art fabrication process at the equivalent stage of the BiCMOS process. The thickness of the combination of layers 27 and 28 is about 340 nm. This subsequent thermal conditioning causes some migration of Vt adjust and APT protection dopants, but is substantially less than would otherwise occur when introducing those dopants prior to gate oxide layer formation.

While the invention has been described with reference to particular example embodiments, it is intended to cover all modifications and equivalents within the scope of the following claims.

I claim:

1. A process for fabricating an intermediate semiconductor device as part of a series of BiCMOS fabrication steps including the formation of a split polysilicon layer used to form a bipolar transistor structure, a PMOS transistor structure, and an NMOS transistor structure, the process comprising the steps of:

a. forming an epitaxial layer of semiconductor material of a certain conductivity type on a semiconductor substrate;

b. forming an insulative oxide layer on a surface of said epitaxial layer;

c. depositing on a surface of said insulative oxide layer amorphous silicon material to form a protective silicon layer thereon;

d. implanting through and under a first portion of said insulative oxide layer and said protective silicon layer a first dopant of a certain conductivity type as a precursor to forming the PMOS transistor structure;

e. implanting through and under a second portion of said insulative oxide layer and said protective silicon layer a second dopant of a certain conductivity type as a precursor to forming the NMOS transistor structure;

f. implanting through and under a third portion of said insulative oxide layer and said protective silicon layer a third dopant of a certain conductivity type as a precursor to forming the bipolar transistor structure;

g. removing said third portion of said insulative oxide layer and said protective silicon layer associated with the bipolar transistor structure; and h. depositing on the surface of the PMOS and NMOS transistor structures and the surface of the bipolar transistor structure after said removing a layer of silicon material as a precursor to forming gates of the MOS transistor structures and an emitter of the bipolar transistor structure.

2. The process as claimed in claim 1 wherein the step of forming said insulative oxide layer is carried out at a first temperature and the step of depositing said amorphous silicon material thereon is carried out in situ at a second temperature different from said first temperature.

3. The process as claimed in claim 2 wherein said first temperature is higher than said second temperature.

4. The process as claimed in claim 3 wherein said first temperature is about 900° C. and said second temperature is about 525° C.

5. The process as claimed in claim 1 wherein said protective silicon layer is deposited to a thickness of about 30 nm.

6. The process as claimed in claim 1 wherein the step of implanting said first set of charge carriers includes the steps of first implanting a first P-type dopant in a first concentration to provide anti-punch-through protection for the PMOS structure and then implanting a second P type dopant in a second concentration to provide threshold-voltage adjustment to the PMOS transistor structure.

7. The process as claimed in claim 6 wherein said first N-type dopant is Arsenic and said second P-type dopant is Boron.

8. The process as claimed in claim 6 wherein the step of implanting said second P-type dopant includes the steps of first implanting a third P-type dopant in a first concentration to provide anti-punch-through protection for the NMOS structure and then implanting said second P-type dopant in a second concentration to provide threshold-voltage adjustment to the NMOS transistor structure.

9. The process as claimed in claim 8 wherein said second P-type dopant is Boron.

10. The process as claimed in claim 9 further comprising the step of processing the intermediate semiconductor device at a temperature high enough to convert said amorphous layer of silicon material into a polycrystalline layer of silicon material.

* * * * *